US007205807B2

(12) United States Patent
Svensson et al.

(10) Patent No.: US 7,205,807 B2
(45) Date of Patent: Apr. 17, 2007

(54) CASCODE SIGNAL DRIVER WITH LOW HARMONIC CONTENT

(75) Inventors: Lars Svensson, Göteborg (SE); Sven Mattisson, Bjärred (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 10/855,369

(22) Filed: May 28, 2004

(65) Prior Publication Data
US 2005/0007149 A1 Jan. 13, 2005

Related U.S. Application Data

(63) Continuation-in-part of application No. 09/567,015, filed on May 9, 2000, now Pat. No. 6,744,294.

(60) Provisional application No. 60/133,886, filed on May 12, 1999.

(51) Int. Cl.
*H03K 5/12* (2006.01)
(52) U.S. Cl. .................... 327/170; 327/112; 326/83
(58) Field of Classification Search ................ 327/170
See application file for complete search history.

(56) References Cited

U.S. PATENT DOCUMENTS

| | | | | |
|---|---|---|---|---|
| 4,069,429 | A | | 1/1978 | White et al. ................ 327/176 |
| 5,128,560 | A | * | 7/1992 | Chern et al. ................. 326/81 |
| 5,187,686 | A | * | 2/1993 | Tran et al. .................. 327/170 |
| 5,198,699 | A | | 3/1993 | Hashimoto et al. ......... 327/170 |
| 5,220,607 | A | | 6/1993 | Rebel ............................. 381/4 |
| 5,408,497 | A | | 4/1995 | Baumann et al. ........... 375/219 |
| 5,512,844 | A | * | 4/1996 | Nakakura et al. ............. 326/27 |
| 5,514,992 | A | | 5/1996 | Tanaka et al. .............. 327/317 |
| 5,557,223 | A | | 9/1996 | Kuo ........................... 327/108 |

(Continued)

FOREIGN PATENT DOCUMENTS

EP 0635932 1/1995

(Continued)

OTHER PUBLICATIONS

Weste et al., Principle of CMOS VLSI Design: A Systems Perspective, 1993, Addison-Wesley Publishing Company, 2$^{nd}$ edition, pp. 183-186.*

(Continued)

*Primary Examiner*—Long Nguyen
(74) *Attorney, Agent, or Firm*—Potomac Patent group PLLC

(57) ABSTRACT

A method and apparatus for minimizing harmonic content in a digital signal driver circuit are disclosed. A digital input signal applied to an input node generates a corresponding digital output in a circuit with two or more MOS devices in cascode connection with each other. The slew rate of leading or trailing edge transitions associated with the output signal are controlled using one or more parasitic capacitances associated with the fabrication of two or cascode connected MOS devices. The two or more cascode connected MOS devices may further each have gate electrodes connected to a fixed potential so as to minimize the harmonic content. A control signal may further be applied to each gate electrode to turn off a leakage current path between source and drain electrodes. Harmonics may further be controlled by limiting a conductance between gate electrodes and fixed potentials using an active or passive device.

21 Claims, 9 Drawing Sheets

U.S. PATENT DOCUMENTS

| | | | |
|---|---|---|---|
| 5,703,519 A * | 12/1997 | Crook et al. | 327/387 |
| 5,748,029 A | 5/1998 | Tomasini et al. | 327/389 |
| 5,811,992 A | 9/1998 | D'Souza | 326/81 |
| 5,946,175 A | 8/1999 | Yu | 361/56 |
| 6,064,230 A | 5/2000 | Singh | 326/81 |
| 6,118,302 A * | 9/2000 | Turner et al. | 326/81 |
| 6,124,741 A * | 9/2000 | Arcus | 327/112 |
| 6,137,338 A * | 10/2000 | Marum et al. | 327/309 |
| 6,144,217 A | 11/2000 | Iwata et al. | 326/27 |
| 6,744,294 B1 * | 6/2004 | Svensson et al. | 327/170 |

FOREIGN PATENT DOCUMENTS

| | | |
|---|---|---|
| JP | 57/31043 | 2/1982 |
| JP | 58/213531 | 12/1983 |
| JP | 63/74323 | 4/1988 |

OTHER PUBLICATIONS

Weste et al., Principle of CMOS VLSI Design—A Systems Perspective, 1993, Addison-Wesley Publishing Company, 2.sup.nd Edition, pp. 183-186.

Keiko Makie-Fukuda, et al., "Substrate noise Reduction using Active Guard Band Filters in Mixed-Signal Integrated Circuits," 1995 Symposium on VLSI Circuits Digest of Technical Papers, Kyoto, Jun. 8-10, pp. 33-34.

Graeme, J., Applications of Operational Amplifiers—Third Generation Techniques, McGraw-Hill, 1973, pp. 53-57.

Microelectronics, Jacob Millman, McGraw-Hill, 1979, pp. 95-96.

* cited by examiner

CASCODE SIGNAL DRIVER WITH LOW HARMONIC CONTENT

RELATED APPLICATION

This application is a continuation-in-part of application Ser. No. 09/567,015 filed May 9, 2000, now U.S. Pat. No. 6,744,294, the entire disclosure of which is expressly incorporated herein by reference and which is related to, and claims priority from, U.S. Provisional Patent Application Ser. No. 60/133,886, entitled "Cascode Signal Driver with Low Harmonic Content", filed on May 12, 1999, the entire disclosure of which is expressly incorporated herein by reference.

BACKGROUND OF THE INVENTION

The present invention relates to circuit design, and more particularly to a method and apparatus for reducing harmonic interference in highly integrated mixed-mode circuits.

Modern telecommunications equipment requires increasing levels of integration for cost-effective manufacturing and to accommodate the trend toward increasingly smaller packaging. In particular, digital and analog system components are increasingly often integrated on the same semiconductor die. For low-cost consumer wireless terminals, such as cellular phones, the trend towards integrating radio-frequency circuitry with digital signal processing elements gives rise to problems traditionally solved by segregating or otherwise isolating analog and digital sections.

Issues of electromagnetic compatibility (EMC) of digital and analog circuitry must be solved for highly-integrated systems to work reliably. In particular, harmonic components of the switching noise of digital circuits can exist with magnitudes comparable to the magnitude of the radio-frequency signals of interest to the analog circuit sections. Harmonic interference introduced by digital circuits can cause degraded receiver performance or spectrum mask violations of transmitted signals.

High levels of high-order harmonics may be caused by abrupt changes in switching currents. Using fundamental Fourier analysis it is apparent that the sharper the edge of signals such as those produced in digital switching circuits, the wider the frequency spectrum of harmonics produced thereby. The greater the magnitude of the switching current, the greater the energy of the associated harmonics, thus increasing the likelihood of in-band noise energy in adjacent RF circuits.

The most abrupt current change in a standard driver is when one device, e.g., the n-channel device, turns on as its gate-source voltage exceeds its threshold voltage. Simple transistor models assume that no current flows below threshold; in actual devices, a small current does flow. The difference between currents above and below threshold is nevertheless pronounced. Due to the speed at which such a device turns on, undesirable high order harmonics may be produced leading to noise coupling into RF sections and reduced EMC between analog and digital sections.

EMC between digital and analog circuitry has traditionally been addressed using a multitude of known methods. Standard methods for the design of low-power digital circuits attempt to reduce the average switching currents and thereby reduce the absolute levels of the harmonics produced thereby. Lowering supply voltages for digital circuits attempts to reduce edge rates, currents and charges of associated digital signals, further reducing the harmonic content of the switching noise produced thereby. Shielding or filtering methods attempt to reduce the level of substrate noise coupling from digital to analog circuit sections (see, for example, Makie-Fukuda et al. 95 K. Makie-Fukuda, S. Maeda, T. Tsukada & T. Matsuura, "Substrate noise reduction using active guard band filters in mixed-signal integrated circuits," Symposium on VLSI Circuits, Kyoto, 8–10 June, pp. 33–34, 1995.).

Noise may be further exacerbated by small reference voltage differences between circuit components. Although these voltages may be reduced by carefully controlling reference voltage levels, they may nevertheless enter unbalanced signal paths through common-impedance coupling and further, may enter balanced paths through common-mode conversion. The periodic charge and discharge of parasitic capacitances may also cause small but significant currents to flow within substrates.

Radio-frequency circuits can be made more noise resilient through techniques such as dual-rail, balanced signal paths. (See, for example, A. Graeme, J, Applications of Operational Amplifiers—Third Generation Techniques, McGraw-Hill, 1973, pgs 53 to 57.) Such methods are increasingly expensive in terms of area, delay, or power dissipation when applied with greater rigor, and do not always provide a satisfactory solution to problems associated with noise reduction.

Some approaches exist for reducing harmonic interference which have provided varying results. For example, U.S. Pat. No. 5,514,992 to Tanaka, discloses a low-distortion cascode amplifier circuit. Distortion may be reduced in Tanaka by virtue of a higher transconductance of the cascode device in relation to the input device when a spectrally well-defined analog signal with few components is applied. However, Tanaka fails to address the spectral qualities of an output signal when a digital switching signal with a large number of ill-defined spectral components are applied to the circuitry.

A further approach to the reduction of undesirable harmonics is disclosed in Japanese Patent JP 63/074323 to Imamura. Imamura discloses a cascode current source with AC feedback wherein output conductance of the current source is frequency-dependent, e.g., some harmonic components of the output signal will be attenuated more than others providing stable current output. Imamura does not disclose, however, an approach for reducing harmonics on an output signal based on a digital switching input signal.

Yet another general approach to avoiding the deleterious effects of such abrupt switching currents is to continuously operate switching devices at a current level above a threshold, with the resulting logic styles resembling bipolar logic styles such as ECL, and the like. Such an approach, however, may be accompanied by negative side effects, including increased static power dissipation, as such devices are never fully turned off.

It would be appreciated in the art therefore for a method and apparatus for reducing the harmonic components associated with digital switching signals thus improving the EMC between analog and digital sections of mixed mode integrated circuitry without the negative side effects created by conventional solutions which attempt to address this problem.

SUMMARY OF THE INVENTION

It is therefore an object of the present invention to provide a method and apparatus capable of reducing high order harmonics associated with a digital switching signal without significantly reducing switching speed.

It is a further object of the invention to provide a method and apparatus that eliminates passive components from a switching circuit design and uses only MOS components.

It is still a further object of the invention to provide a method and apparatus that provides a signal driver that is node compatible with existing driver circuits and therefore does not require modification to existing circuit layout tools.

It is an additional object of the invention to provide a method and apparatus that incorporates parasitic capacitance as a by product of fabrication to reduce high order harmonics.

It is still an additional object of the invention to provide a method and apparatus that increases or adds additional parasitic capacitance or adds additional capacitance to the parasitic capacitance produced as a by-product of fabrication in order to reduce high order harmonics.

In accordance with one aspect of the invention, the foregoing and other objects are achieved in a method and apparatus for reducing harmonics in a switching voltage waveform using first and second MOS switches to drive a load. The first and second MOS switches in accordance with the present invention may be an N-channel and a P-channel switch coupled together. Each N-channel and P-channel switch may further include two devices in cascode connection such that the rate of change of current through the load is not as abrupt as with conventional methods for digital signal switching.

In accordance with another aspect of the invention, first and second MOS switches may drive a load that has different timing requirements for the leading and trailing signal edge transitions. For example, for a load that requires a fast trailing edge from an applied switching signal, a driver in accordance with the present invention may use a cascode connection on the one of the first and second MOS switches responsible for generating the rising edge of the signal and vice versa. The cascode switch, in providing a slower edge transition, may produce fewer harmonics. Such a single sided driver would reduce power dissipation and silicon area.

In accordance with still another aspect of the invention, a control signal may be applied to one or both cascode switches to disable the associated cascode switch during idle periods. Such a control signal would reduce standby currents.

In accordance with yet another aspect of the invention, by controlling capacitive coupling between the output node, cascode nodes, and gate nodes and controlling conductance between the output node, cascode nodes, gate nodes and supply planes, performance may be improved.

BRIEF DESCRIPTION OF THE DRAWINGS

The objects and advantages of the invention will be understood by reading the following detailed description in conjunction with the drawings, in which.

DETAILED DESCRIPTION OF THE INVENTION

Figure 1A:
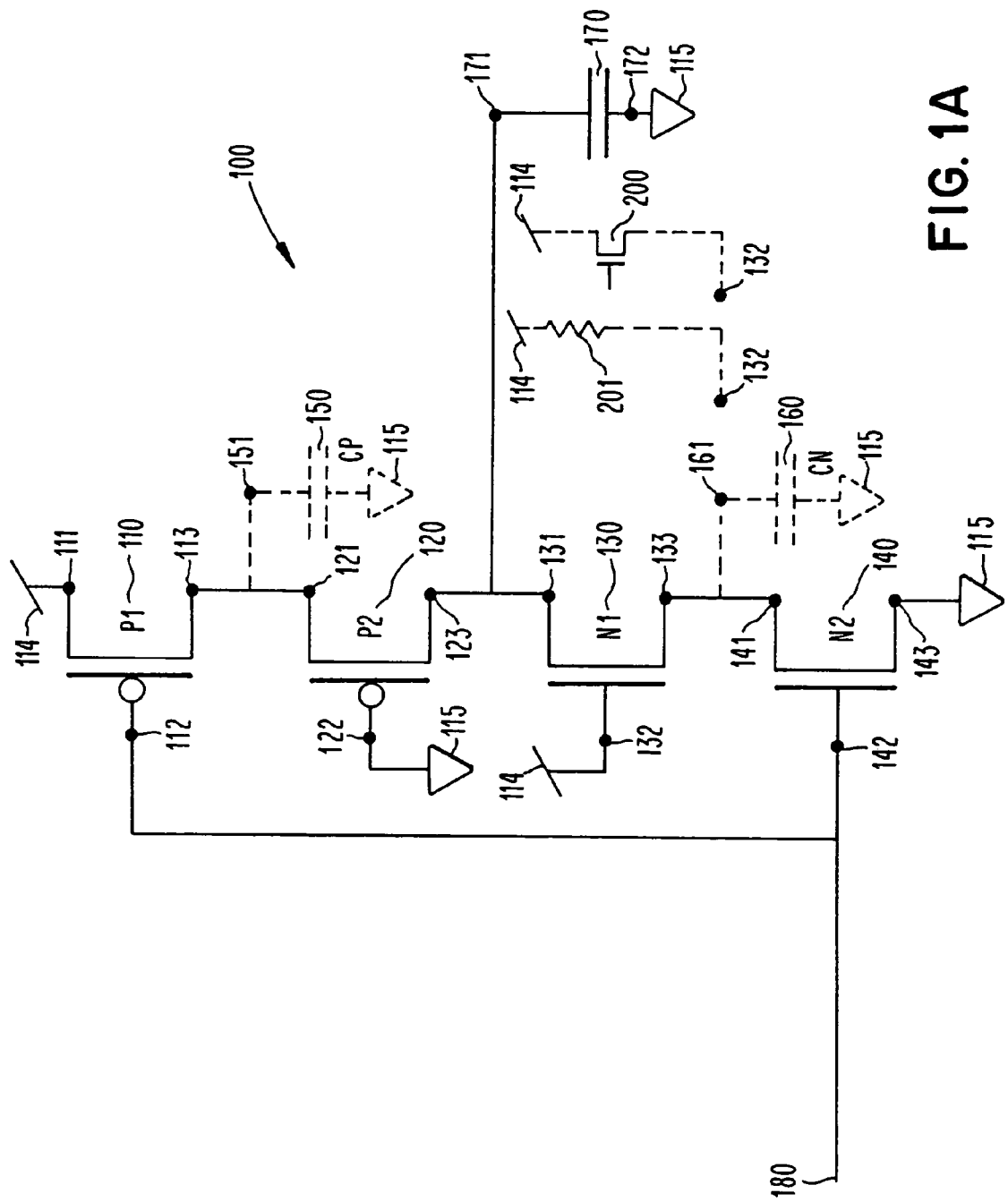
FIG. 1A is schematic diagram illustrating exemplary N and P type MOS switches with exemplary cascode connected devices and parasitic capacitances in accordance with one aspect of the present invention.

The various features of the invention will now be described with reference to the figures, in which like parts are identified with the same reference characters.

In the following description, reference is made to various devices, units, and the like. It will be understood that any and all of such devices, units, and the like can be implemented in any of a number of well-known techniques, including implementation by means of a suitable set of program instructions stored on a computer readable storage medium (e.g., various types of magnetic and optical storage media) for controlling a general purpose processor, as well as by means of specially designed dedicated hardware components. Any and all of such embodiments, and combinations thereof, are intended to be included within the scope of the following figures and discussion.

As can be seen from FIG. 1A, exemplary driver 100 is shown in accordance with the present invention which uses cascode-connected devices P1 110, P2 120, N1 130, and N2 140. The operation of driver 100 may be described generally as follows: when the voltage level on input node 180 is low, a low level may be correspondingly applied to gate node 132 of N1 130 (i.e., common-gate MOS device) and gate node 142 of N2 140 thus biasing N1 130 and N2 140 in the off or non-conducting state. The low signal applied to input node 180 may be correspondingly applied to gate node 112 of P1 110 and gate node 122 of P2 120 (i.e., common-gate MOS device) thus biasing P1 110 and P2 120 in the on or conducting state. Accordingly, the signal level appearing at output node 171 is high consistent with being connected to supply rail 114. Parasitic capacitance CN 160 may be charged to a voltage level corresponding to the threshold voltage of N2 140. Parasitic capacitance CP 150 will be charged to the voltage level of supply rail 114. The capacitance value of CP 150 and CN 160 may further be incorporated as a design parameter to impact the speed at which the transitions occur in the corresponding cascode devices. In other words, the slew rate is controlled to have different timing requirements at leading and trailing edge transitions (i.e., during switching) associated with an output signal based on parasitic capacitance associated with two or more cascode connected MOS devices to minimize harmonic content when at least one of the gate electrodes (i.e., common-gate MOS device) is connected to a fixed potential. Thereafter, when the circuit is in an idle period (i.e., after switching) a control signal is applied to at least another of the gate-electrodes of the cascode connected MOS devices to turn off a leakage current path between the corresponding each source and drain electrodes.

Figure 1B:
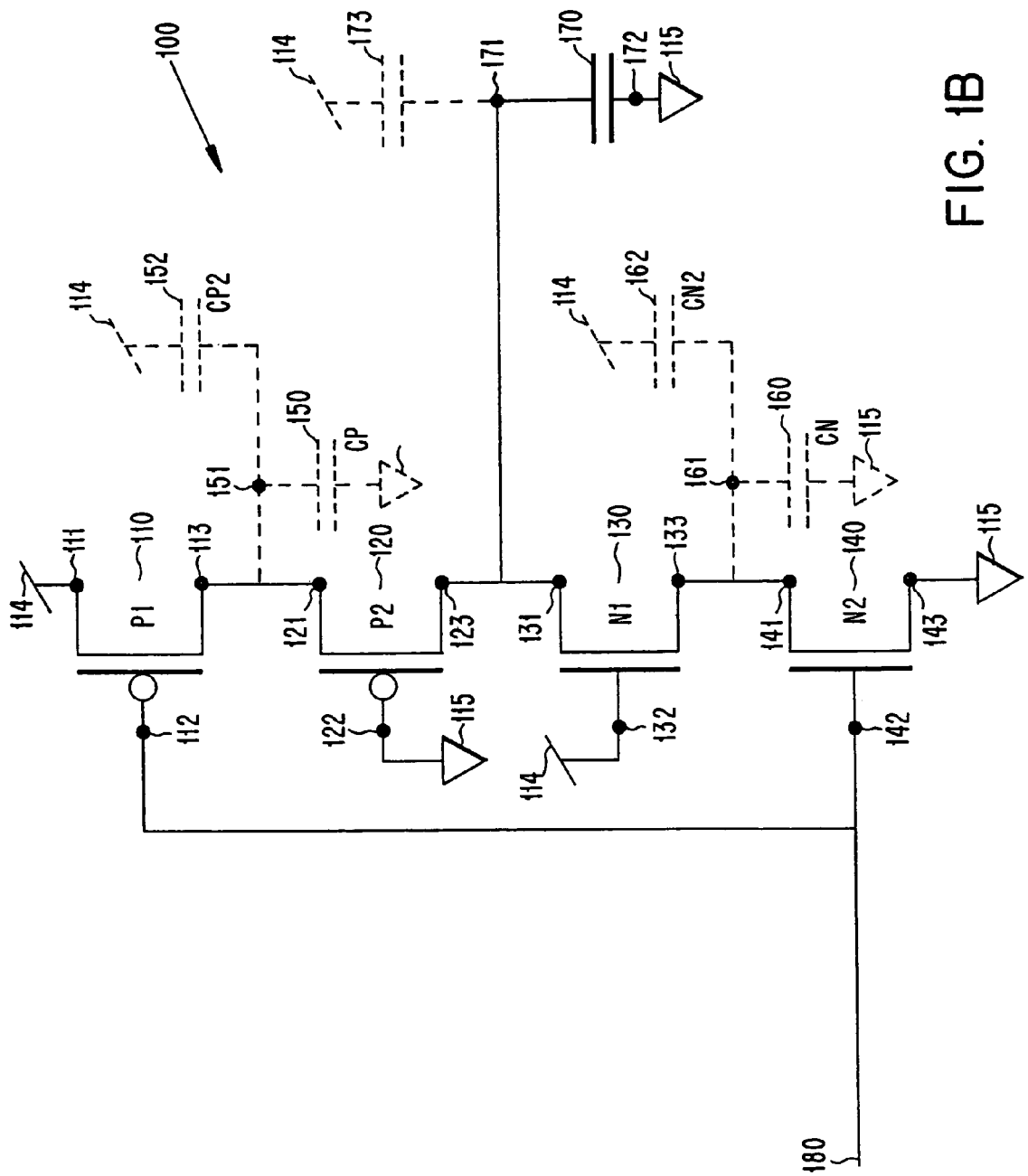
FIG. 1B is schematic diagram illustrating exemplary N and P type MOS switches with exemplary cascode connected devices, parasitic capacitances in an alternative configuration further in accordance with another aspect of the present invention.

FIG. 1B shows another way to impact edge transitions such as by adding additional capacitance. In particular, capacitive coupling of output node 171 and cascode nodes 151 and 161 to gate nodes 122 and 132 of cascode devices P2 120 and N1 130 (i.e., common-gate MOS devices) together with limiting conductance to supply rails 114 and 115 further improves performance with added capacitances CN2 162, CP2 152 and output capacitance 173.

As shown in FIGS. 1A and 1B, when the voltage level on input node 180 and thus the voltage level applied to gate node 142 of N2 transitions to positive-going and reaches the threshold voltage of N2 140, N2 140 conducts and begins to discharge CN 160. The discharge of CN 160 and the corresponding fall in voltage level at node 161, in common with drain node 141 of N2 140 and source node 133 of N1 130 serves to turn on N1 130, which in turn begins to discharge load capacitance 170. Thus, by controlling parasitic capacitances, signal output characteristics may be controlled.

Figure 1C:
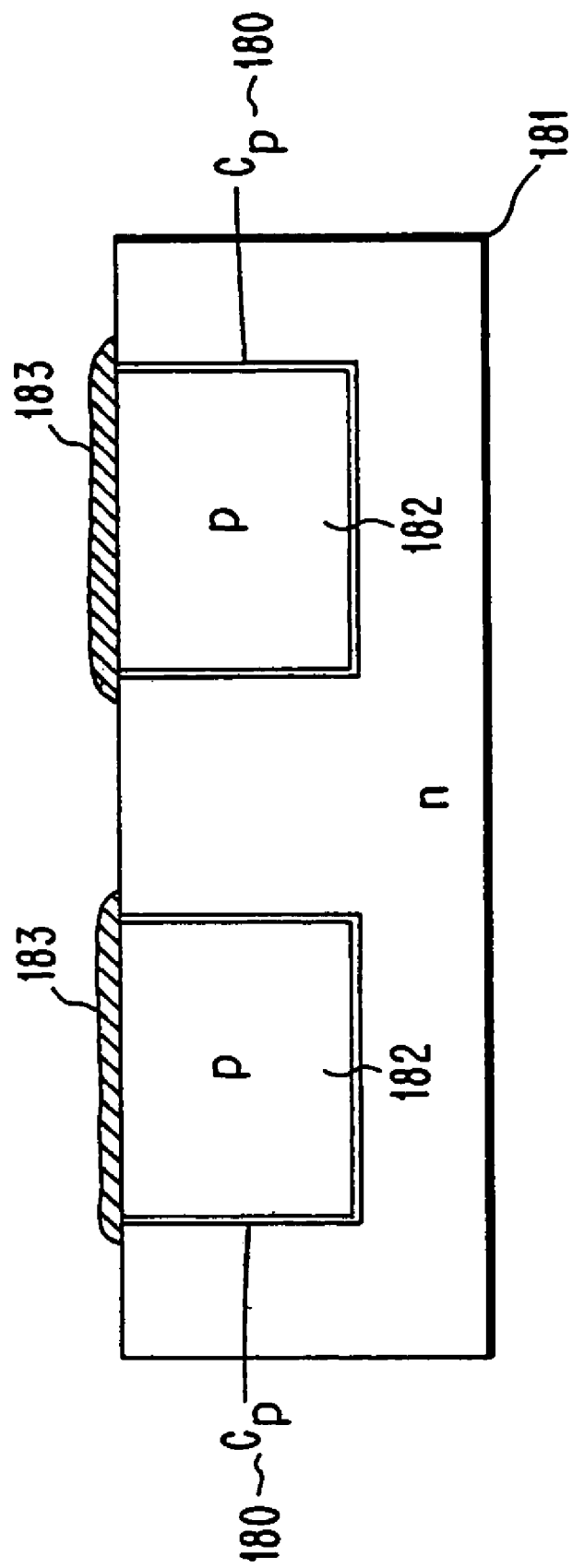
FIG. 1C is diagram illustrating an exemplary n type substrate and p type MOS channels with exemplary parasitic capacitances in accordance with another aspect of the present invention.

As is illustrated in FIG. 1C, parasitic capacitance is a by-product of semiconductor fabrication. Exemplary n substrate 181 may be diffused in an isolation diffusion process using masks 183, or otherwise processed as is known in the art, to create p regions 182. Both p regions 182 may be connected to n substrate 181 through a barrier known as a transition capacitance or parasitic capacitance CP 180. For more detailed explanation, see Microelectronics, Jacob Millman, McGraw Hill 1979, pp 95–96. It is important to note that since transition capacitance is a by-product of fabrication, it can thereby be controlled to provide advantages in accordance with the present invention.

Figure 2A:
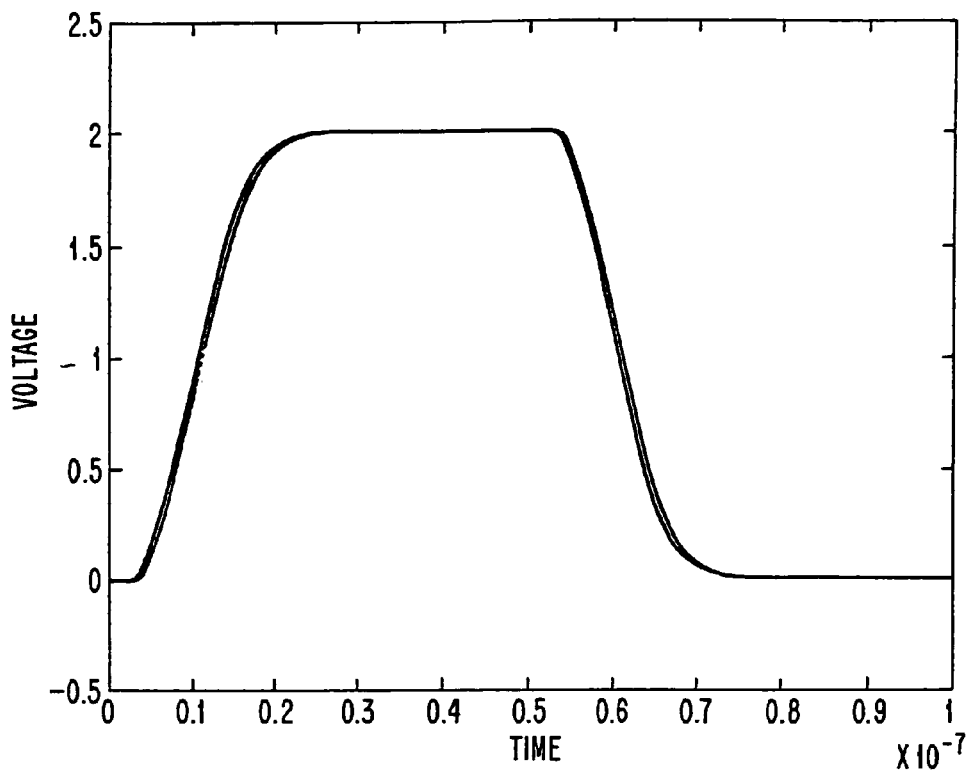
FIG. 2A is a graph illustrating an exemplary voltage waveform generated in accordance with the present invention.
Figure 2B:
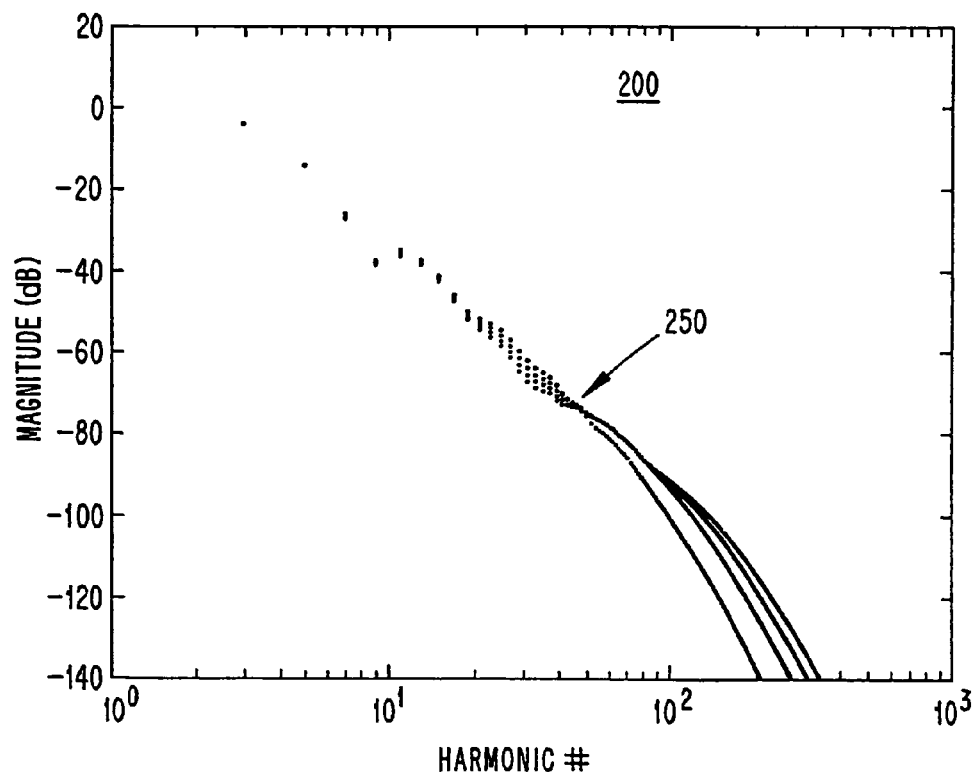
FIG. 2B is a graph illustrating an exemplary frequency spectrum associated with the exemplary voltage waveform illustrated in FIG. 2A, generated in accordance with the present invention.

Referring now to FIG. 2A and FIG. 2B, since the charge on CN 160 may be represented as an additional state variable in the circuit analysis of driver 100, an extra high-frequency rolloff in the harmonic spectrum is introduced. As illustrated in FIG. 2B, the ratio of the parasitic capacitance to the load capacitance influences the location of breakpoint 250 of the spectrum rolloff 200. A higher value for parasitic capacitance CP 150 and/or CN 160 slows the associated voltage change at the respective cascode node 151 and/or 161 and thus reduces the rate of change of the output current level resulting in greater attenuation of the high-order harmonics as shown in FIG. 2B. Relative widths of cascode devices P1 110, P2 120 and N1 130, N2 140 (i.e., N1/N2 and/or P2/P1) as compared to the input-connected devices (not shown) may further affect the harmonic spectra at output node 170.

Driver 100 may be primarily suitable for relatively large loads that are primarily attributable to relatively large overhead, in terms of hardware, dynamic power dissipation, and the like. Accordingly, driver 100 in accordance with the present invention may be particularly well suited for driving, for example, off-chip loads. Moreover, the harmonic spectrum of current pulses associated with the operation of driver 100 on supply rail 114 is much less than that associated with load 170 as, for example, CN 160 is in saturation during turn on, and its drain current is only weakly related to drain voltage. Therefore, driver 100 would be further well suited for application where the main transport mechanism for switching noise is capacitive coupling associated with output node 171 and its associated circuit network.

Figure 3:
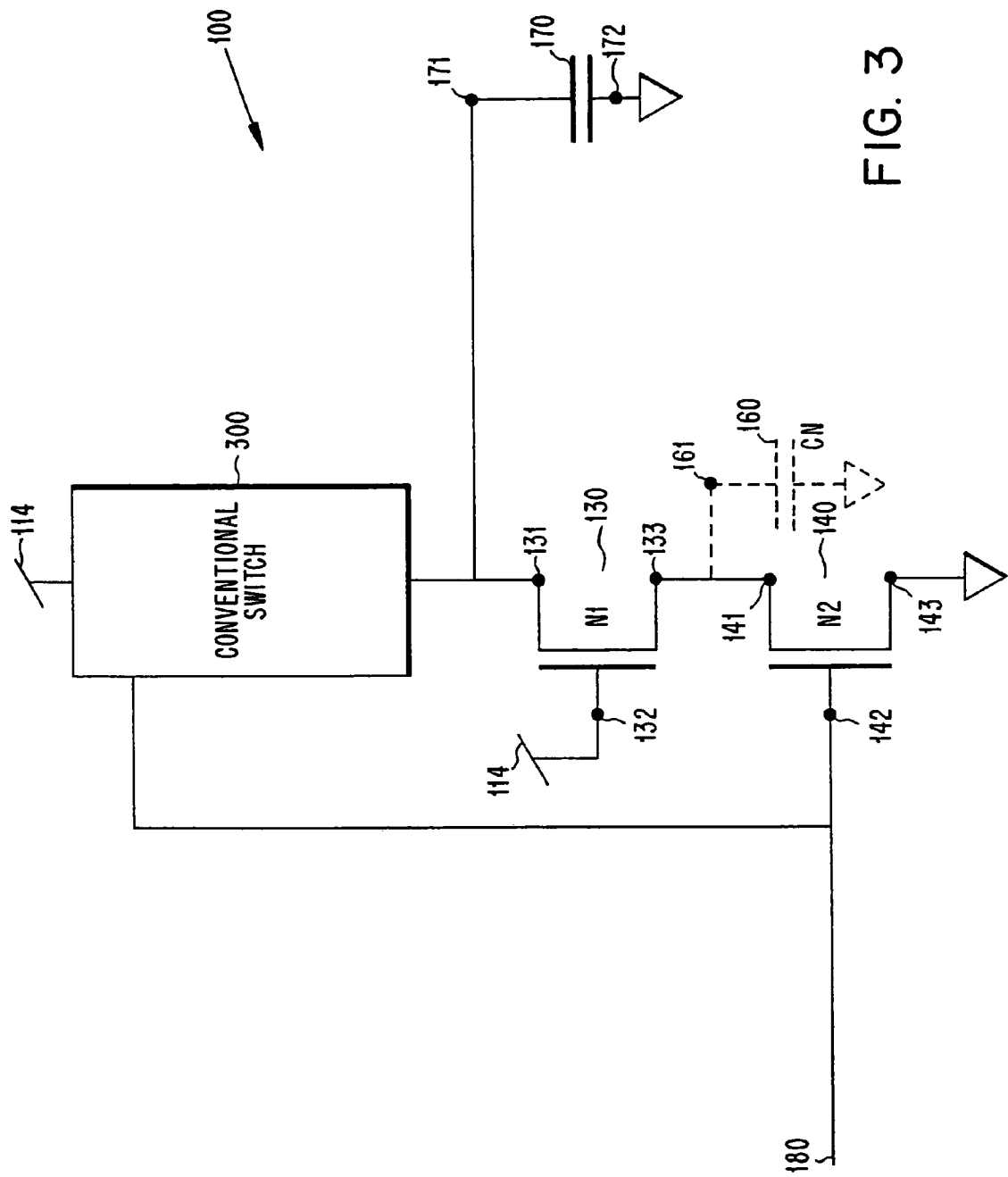
FIG. 3 is schematic diagram illustrating an exemplary N type MOS switch with exemplary cascode connected devices in accordance with another aspect of the present invention.
Figure 4:
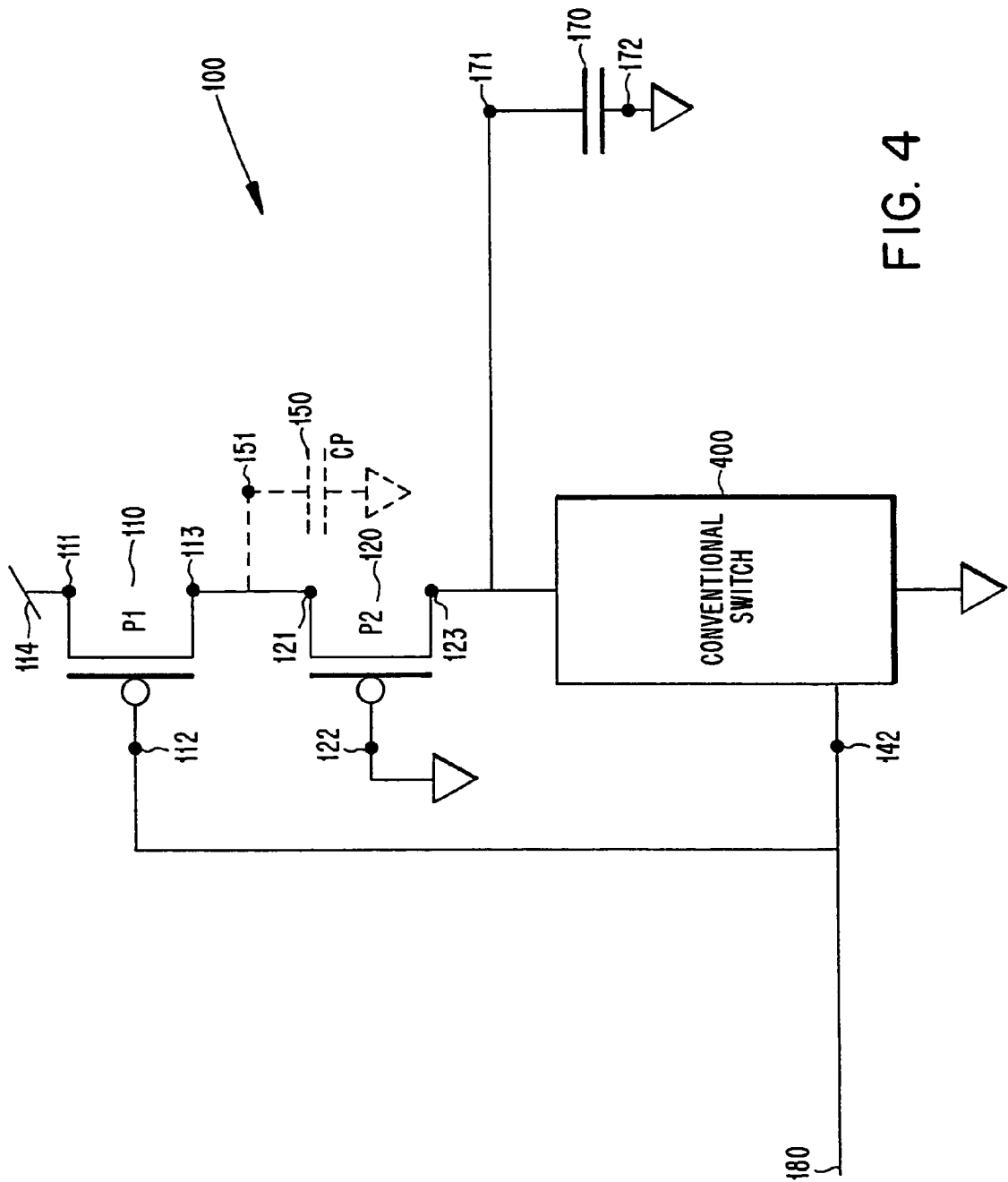
FIG. 4 is schematic diagram illustrating an exemplary P type MOS switch with exemplary cascode connected devices in accordance with still another aspect of the present invention.

In accordance with further embodiments of the present invention as illustrated in FIG. 3 and FIG. 4, a single-sided version of driver 100 may be envisioned where, for example, only the nFET branch, e.g., N1 130 and N2 140 in FIG. 3 or only the pFET branch, e.g., P1 110 and P2 120 in FIG. 4 would use a cascode connection. Such embodiments may be useful where the transition time requirements for one edge transition of a signal output at node 171 are much more stringent than for the other. For example, to reduce harmonics on the rising edge of a signal output at node 171 having relatively stringent timing requirements for the falling edge transition, pFET branch, e.g., P1 110 and P2 120 in FIG. 4 may be cascode connected and would operate in the above described manner associated with the description of FIG. 1. Conversely, nFET branch 400 could be configured in a more conventional manner (not shown in detail) to meet more stringent falling edge timing requirements. Accordingly, with more stringent rising edge timing requirements, nFET branch, e.g., N1 130 and N2 140 in FIG. 3 could be cascode connected to provide a reduced harmonic content falling edge with pFET branch 300 connected in a more conventional manner to provide improved timing for a rising edge.

Figure 5:
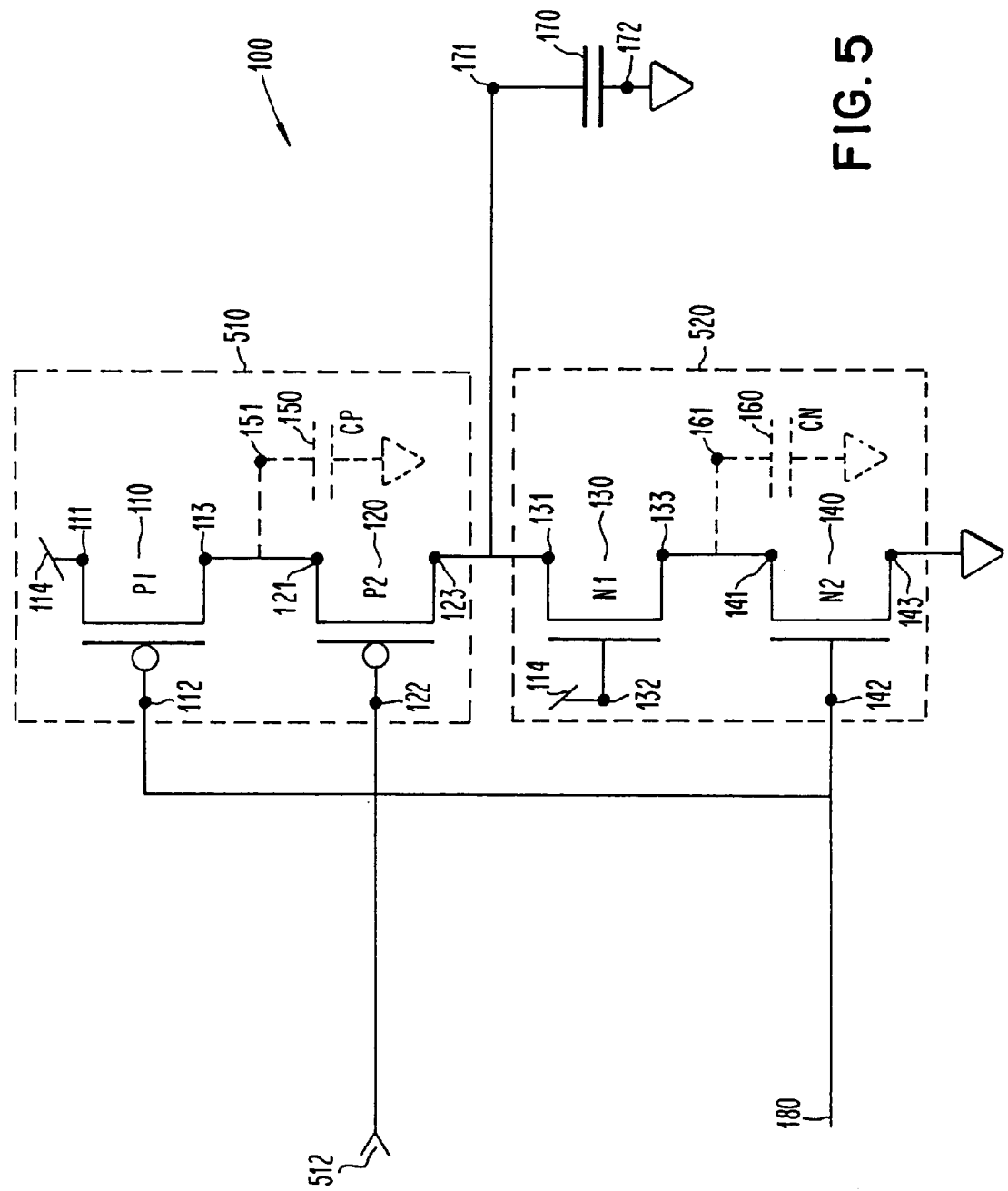
FIGS. 5 and 6 are schematic diagrams illustrating exemplary N and P type MOS switches with exemplary cascode connected devices and control signals in accordance with yet another aspect of the present invention.
Figure 6:
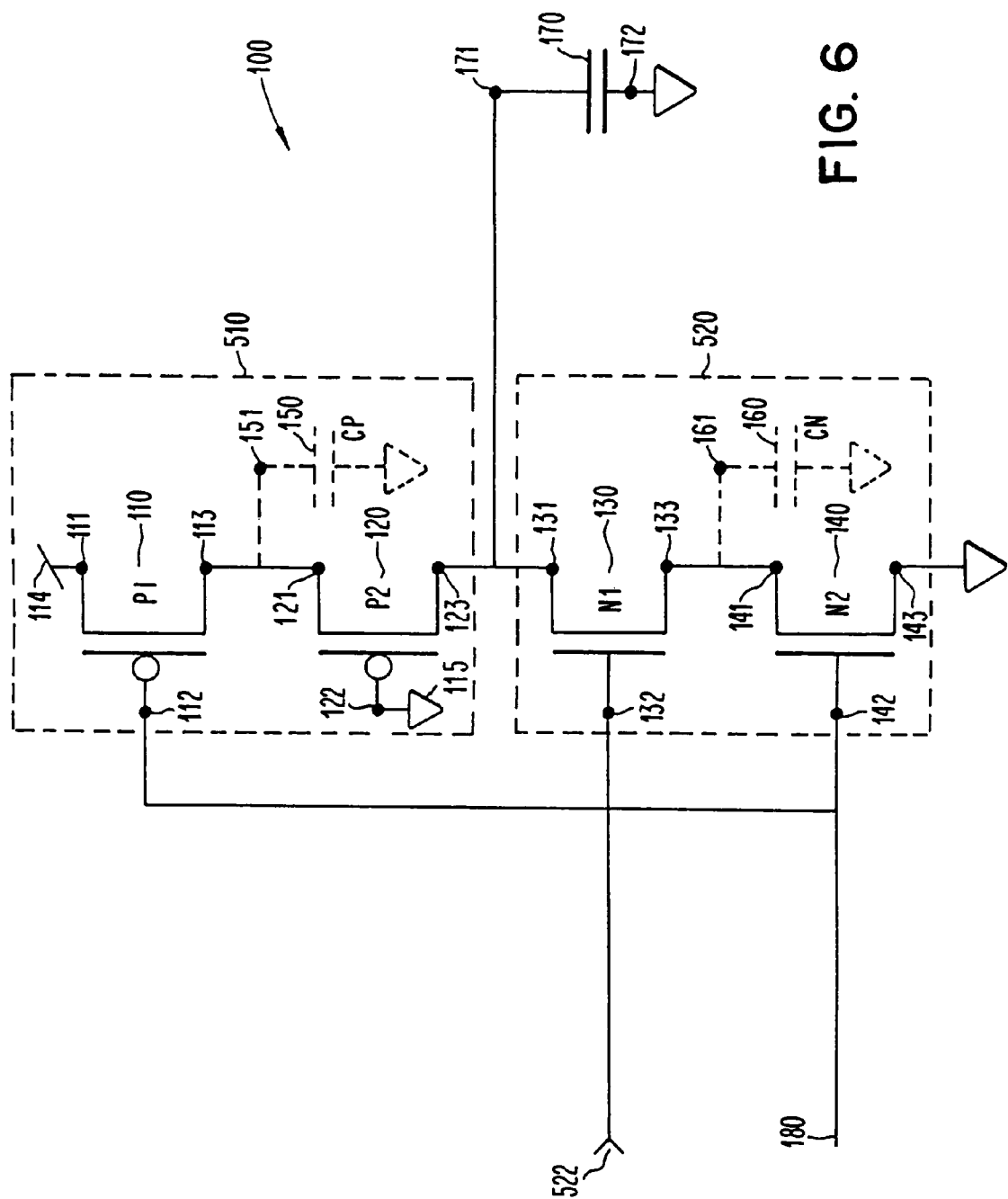

In accordance with yet another embodiment of the present invention, cascode connected switches P1 110, P2 120 and N1 130, N2 140 whether configured for single or dual cascode operation as in any of the foregoing embodiments, may be connected to a control signal as illustrated in FIGS. 5 and 6. Control signals 512 and 522 would turn off cascode devices 510 and 520 respectively during prolonged idle periods. Such a procedure would help reduce standby current in a low-threshold process.

As discussed above, in order to minimize harmonic content of a digital signal, parasitic capacitance associated with the fabrication of two or more cascode connected MOS devices are used in order to control the edge transitions of the output signal. Parasitic capacitance includes not only that produced as a by-product of fabrication, but in addition can include any additional parasitic capacitance which is added or increased or an added capacitance. Thus, parasitic capacitance may include:

1) increasing the parasitic capacitance (i.e., CN and/or CP in FIGS. 1A, 1B, 1C) between the cascode node 151, 161 and the substrate 181, 2) changing the relative widths of N1/N2 and/or P2/P1 (or change the relative lengths of the two devices to accomplish a device area and aspect ratio difference), or 3) increasing the resistance applied to the N1 and/or P2 gate.

In other words, the term parasitic capacitance includes not only the design parasitic capacitance but can also include increasing the parasitic capacitance between the cascode node and the substrate as an additional way to impact the speed at which the edge transitions will occur in the corresponding cascode devices. Another way to impact the speed of edge transitions, is to increase the N1 and/or P2 gate resistance. In other words, extra resistance is added as applied to the N1 and/or P2 gates. Thus, if resistance is increased, more current is allowed to go into the parasitic capacitor which has an effect similar to adding a capacitance. For example, the extra resistance can be inserted in series with N1 and/or P2 such as by adding a resistor or adding a pass transistor in order to increase the resistance. An additional way to impact edge transition is to change the relative widths of N1/N2 and/or P2/P1.

Thus, the three methods outlined above represent various ways to influence a filter time constant and transfer function of a circuit in order to reduce the high-frequency contents in the drive current. In particular, the current leaving N2 (P1) will be divided between the N1 (P2) source and the parasitic capacitance CN (CP). For simplicity, assuming that all capacitance at this interstage node can be associated with CN (CP), the current gain from the N2 (P1) drain to the driver output (i.e., the load capacitance 170) is derived as follows:

$$\frac{i_o(s)}{i_d(s)} = \frac{g_{mN_2}}{g_{mN_2} + s \cdot CN} = \frac{1}{1 + s \cdot \frac{CN}{g_{mN_2}}} = \frac{1}{1 + s \cdot \tau_N} \quad (1)$$

which represents a low-pass filter function with a time constant $\tau N$ ($\tau_p$ in the PMOS case), s is a Laplace transformation and $g_{mN2}$ is gain/transconductance. With a large time constant, high-frequency components of the output current will be attenuated. Thus, less interference will be generated by the driver circuit. It is important to lower the driver-current harmonic content since this may pass through the bonding wires via the output node as well as via the supply bonding wires. High-frequency components in these currents will couple inductively to sensitive circuitry, for example the low-noise amplifier inputs.

Figure 7:
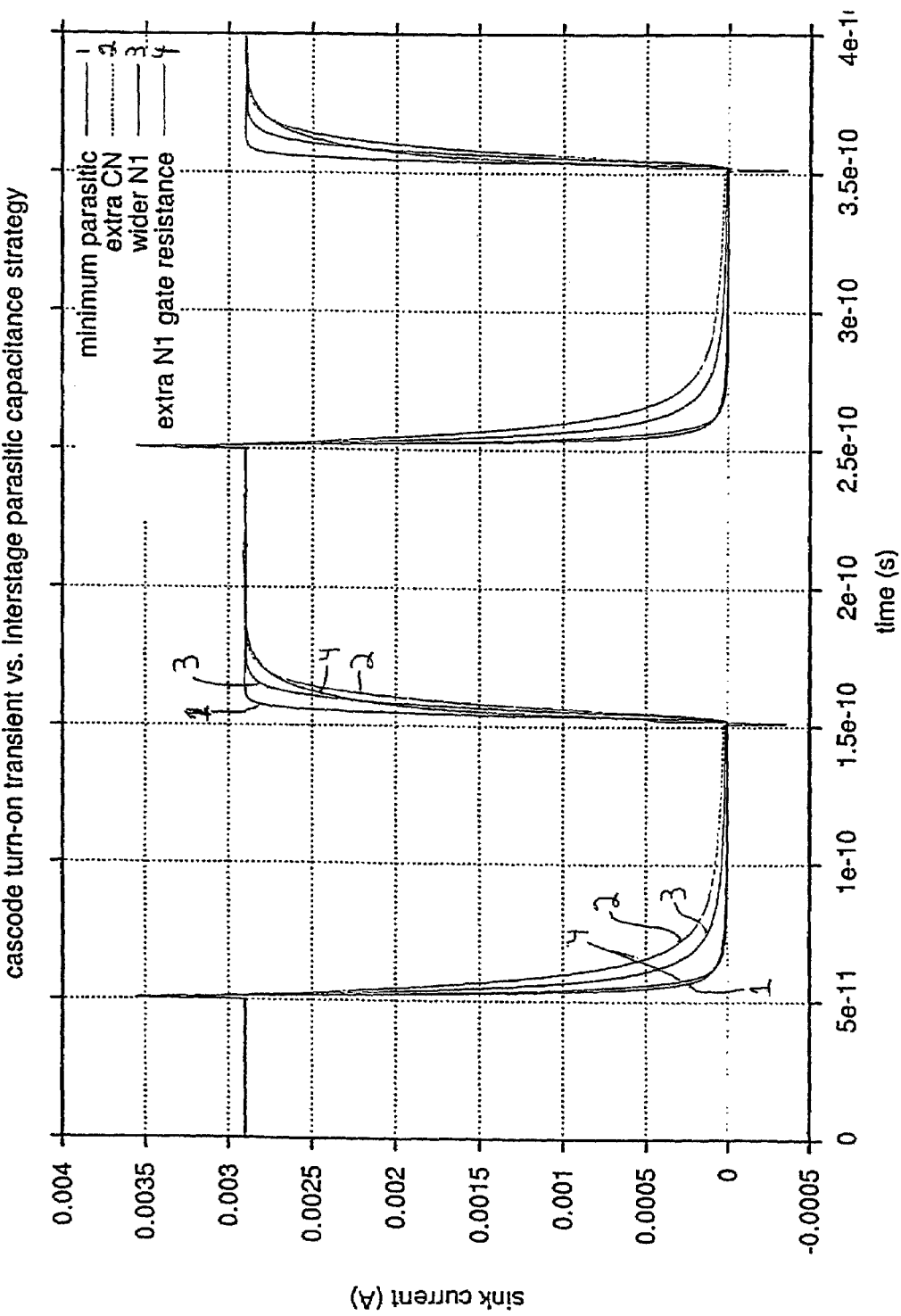
FIG. 7 is a graph illustrating how harmonic content is lowered with different parasitic capacitance strategies.

As an example, as shown in FIG. 7, the NMOS part of a tentative driver circuit has been simulated using model parameters from a typical 0.13 μm CMOS technology node. The driver is designed to deliver some 3 mA peak from a 1.25V supply resulting in 10 μm wide devices (N1 and N2 for a typical design). Since the driver current is being analyzed, it can be assumed, without loss of generality, that the driver output assumes a high voltage which is equal to the supply voltage.

When a voltage step is applied to the driver input, its current will rise quickly to the peak level and will stay there until the input step is removed (or when the driver output goes low). The rising edge of the driver current will determine the harmonic contents in the current pulse. The standard driver results in curve 1 in FIG. 7. Thus, one approach to lowering the harmonic content is to increase the parasitic capacitance or to add additional parasitic capacitance or to add capacitance (see curve 2). Increasing CN by 50 fF results in a smoother step (see curve 2 in FIG. 7). For curve 2, for example, the $7^{th}$ harmonic is some 4 dB lower than for the standard driver shown in curve 1.

Another approach to lowering the harmonic contents is to change the width of N1 relative to N2. This is represented by curve 3 in FIG. 7. The width of N1 is double with respect to N2 and its length is almost double in order to maintain the peak current the same as the standard driver. As a result, there is a 2 dB extra suppression of the $7^{th}$ harmonic when curve 3 is compared with curve 1. It should be noted that although only changing the width is mentioned, it should be obvious to those skilled in the art that relative lengths of the two devices may also be changed to accomplish a device area and aspect ratio difference.

Another method to lower harmonic contents is represented by curve 4 in FIG. 7. Here, an extra resistance of 1.2 kΩ has been inserted in series with the N1 gate (and/or P2 gate). The same effect could be accomplished by adding a pass transistor or any other device or means in order to increase resistance. The pass transistor/device/means is of particular interest since it enables the use of plain CMOS technology, without resistor options and since the device may be turned off to reduce leakage current (through the cascade devices as the common gate device will now be biased with Vgs=0). Thus, by increasing resistance, more current is allowed to go into the parasitic capacitor. Therefore, by adding a resistance or by adding a pass transistor or any other device or means which will increase resistance, an effect which is similar to adding a capacitance results. A net 2 dB reduction of the $7^{th}$ harmonic is achieved when curve 4 is compared with curve 1.

In the above examples, a relatively modest shaping of the driver-current rising edge has been sought not to impair the turn-on delay by too much. Obviously, requirements arising from the desired circuit will determine what is an acceptable delay and harmonic suppression level.

The invention has been described with reference to a variety of embodiments. However, it will be readily apparent to those skilled in the art that it is possible to embody the invention in specific forms other than those of the preferred embodiment described above. This may be done without departing from the spirit of the invention. For example, it may be desirable to provide capacitive coupling of the output and cascode nodes to the gate nodes of the cascode devices along with limited conductance to the supply network to improve performance. This can be accomplished, for example, by using a MOSFET 200 or resistor 201 connected to gate 132 in FIG. 1A (or to gate 122 of P2 in FIG. 4) to amplify the influence of the parasitic capacitance to limit the rate of change of charge even further. The preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A method for controlling harmonic content in a digital signal driver circuit, having a digital input signal applied to an input node associated with said driver circuit and generating a corresponding digital output signal on an output node associated with said driver circuit, said method comprising the steps of:

connecting two or more MOS devices in cascode connection with each other and with said input node and said output node, wherein a first of the MOS devices is configured in a common source arrangement having a gate that receives the digital input signal, and a second of the MOS devices is configured in a common gate arrangement such that a source of the second MOS device is electrically connected to a drain of the first MOS device;

connecting an added capacitance element between a source of the first MOS device and a source of one of the MOS devices other than the first MOS device; and controlling a slew rate of at least one of leading and trailing edge transitions associated with said output signal based on the added capacitance element in combination with one or more parasitic capacitances associated with said two or more cascode connected MOS devices, wherein said parasitic capacitances includes at least capacitance as a by-product of fabrication.

2. The method of claim 1, wherein said method further comprises the step of applying a control signal to a gate electrode of one of the MOS devices other than the first MOS device to turn off a leakage current path through said MOS devices.

3. The method of claim 1, wherein each of the MOS devices includes a gate electrode, and the method further comprises the step of limiting a conductance between at least one of said gate electrodes and a fixed potential.

4. The method of claim 3, wherein said step of limiting includes limiting said conductance using an active device.

5. The method of claim 3, wherein said step of limiting includes limiting said conductance using a passive device.

6. The method of claim 4, wherein said step of using an active device includes using a pass transistor.

7. The method of claim 5, wherein said step of using a passive device includes using a device which will increase resistance.

8. A digital signal driver circuit for controlling harmonic content, said circuit having an input node for receiving a digital input signal and an output node for outputting a corresponding digital output signal, said circuit comprising:
  two or more MOS devices in cascode connection with each other and connected with said input node and said output node, wherein a first of the MOS devices is configured in a common source arrangement having a gate that receives the digital input signal, and a second of the MOS devices is configured in a common gate arrangement such that a source of the second MOS device is electrically connected to a drain of the first MOS device;
  an added capacitance element connected between a source of the first MOS device and a source of one of the MOS devices other than the first MOS device; and
  one or more parasitic capacitance value means, associated with said two or more cascode connected MOS devices, wherein the added capacitance element in combination with said one or more parasitic capacitance value means control a slew rate of at least one of leading and trailing edge transitions associated with said output signal, wherein said one or more parasitic capacitance value means include at least capacitance as a by-product of fabrication.

9. The circuit of claim 8, comprising means for applying a control signal to a gate electrode of one of the MOS devices other than the first MOS device to turn off a leakage current path through said MOS devices.

10. The circuit of claim 8, wherein each of the MOS devices includes a gate electrode, and the circuit further comprises a conductance limiting element connected between one of said gate electrodes and a fixed potential.

11. The circuit of claim 10, wherein said conductance limiting element is an active device.

12. The circuit of claim 10, wherein said conductance limiting element is a passive device.

13. The circuit of claim 11, wherein the active device is a pass transistor.

14. The circuit of claim 12, wherein the passive device is a device which will increase resistance.

15. A digital signal driver circuit comprising:
  an input node for receiving an input voltage;
  an output node for outputting a corresponding digital output signal;
  at least two metal oxide semiconductor (MOS) devices connected in cascode to one another and connected between said input node and said output node to supply current to said output node based on said received input voltage, wherein a first of the MOS devices is configured in a common source arrangement having a gate that receives the input voltage, and a second of the MOS devices is configured in a common gate arrangement such that a source of the second MOS device is electrically connected to a drain of the first MOS device;
  an added capacitance element connected between a source of the first MOS device and a source of one of the MOS devices other than the first MOS device; and
  at least one parasitic capacitance value means, associated with said at least two cascode connected MOS devices, wherein said added capacitance element in combination with said at least one parasitic capacitance value means control a slew rate to have different timing requirements for leading and trailing edge transitions associated with said output signal, wherein said at least one parasitic capacitance value means includes at least capacitance as a by-product of fabrication.

16. The driver circuit of claim 15, further comprising:
  means for turning off said at least two MOS devices during idle periods.

17. The driver circuit of claim 15, wherein said at least two cascode connected MOS devices include two N-type MOS devices cascode connected to operate as a switch.

18. The driver circuit of claim 15, wherein said at least two cascode connected MOS devices include two P-type MOS devices cascode connected to operate as a switch.

19. The driver circuit of claim 15, wherein said at least two cascode connected MOS devices include two P-type and two N-type MOS devices cascode connected to operate as a switch.

20. The driver circuit of claim 15, wherein each of the MOS devices includes a gate electrode, and the driver circuit further comprises a pass transistor connected between one of said gate electrodes and a fixed potential.

21. The driver circuit of claim 15, wherein each of the MOS devices includes a gate electrode, and the driver circuit further comprises a device which will increase resistance, said device being connected between one of said gate electrodes and a fixed potential.

* * * * *

UNITED STATES PATENT AND TRADEMARK OFFICE
CERTIFICATE OF CORRECTION

PATENT NO. : 7,205,807 B2  Page 1 of 1
APPLICATION NO. : 10/855369
DATED : April 17, 2007
INVENTOR(S) : Svensson et al.

It is certified that error appears in the above-identified patent and that said Letters Patent is hereby corrected as shown below:

Title Page, Item (73), under "Assignee", in Column 1, Line 1, delete "L M" and insert -- LM --, therefor.

In Column 3, Line 12, delete "by product" and insert -- by-product --, therefor.

In Column 7, Line 19, delete "τN" and insert -- $\tau_N$ --, therefor.

Signed and Sealed this

Seventeenth Day of June, 2008

JON W. DUDAS
*Director of the United States Patent and Trademark Office*